United States Patent
Yen et al.

(10) Patent No.: US 7,605,654 B2
(45) Date of Patent: Oct. 20, 2009

(54) TELESCOPIC OPERATIONAL AMPLIFIER AND REFERENCE BUFFER UTILIZING THE SAME

(75) Inventors: Yung-Chih Yen, Tainan (TW); Hung-Sung Li, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/047,415

(22) Filed: Mar. 13, 2008

(65) Prior Publication Data
US 2009/0231037 A1 Sep. 17, 2009

(51) Int. Cl.
*H03F 3/45* (2006.01)
(52) U.S. Cl. ..................................... 330/253
(58) Field of Classification Search .............. 330/253, 330/252–261
See application file for complete search history.

(56) References Cited

U.S. PATENT DOCUMENTS

| | | | | |
|---|---|---|---|---|
| 6,833,760 | B1 * | 12/2004 | Aude | 330/297 |
| 7,224,224 | B2 * | 5/2007 | Sera et al. | 330/253 |
| 7,432,762 | B2 * | 10/2008 | Bhattacharya et al. | 330/253 |

\* cited by examiner

*Primary Examiner*—Robert Pascal
*Assistant Examiner*—Khiem D Nguyen
(74) *Attorney, Agent, or Firm*—Thomas, Kayden, Horstemeyer & Risley

(57) ABSTRACT

A telescopic operational amplifier including a current source, an input stage, and a load stage is provided. The input stage is coupled to the current source and includes a group of input transistors for receiving an input voltage. The load stage is coupled to the input stage and includes a group of load transistors for outputting an output voltage. The threshold voltages of the group of input transistors are larger than that of the group of load transistors.

12 Claims, 6 Drawing Sheets

TELESCOPIC OPERATIONAL AMPLIFIER AND REFERENCE BUFFER UTILIZING THE SAME

BACKGROUND OF THE INVENTION

1. Field of the Invention

The invention relates to an operational amplifier (OPAMP), and more particularly to a telescopic operational amplifier.

2. Description of the Related Art

With semiconductor technology development, analog to digital converters (ADCs) operate at lower voltage. Thus, the reference buffer of the ADC is required to operate at lower voltage. When speed and resolution of an ADC are higher, the reference buffer of the ADC must have high bandwidth.

FIG. 1 is a schematic diagram of a conventional reference buffer. Reference buffer 100 comprises a differential OPAMP 110, resistors R1 and R2. Resistors R1 and R2 generally comprise the same impedance for obtaining a compromise between gain and bandwidth of differential OPAMP 110.

FIG. 2 is a schematic diagram of the differential OPAMP 110 of FIG. 1. Differential OPAMP 110 is a two stage structure for obtaining high gain and low output impedance. However, in high speed design, the second stage of differential OPAMP 110 usually consumes a large amount of current in order to push the second pole far away. Additionally, because the feedback factor of differential OPAMP 110 is approximately 0.5, the closed loop bandwidth of differential OPAMP 110 is half compared to the unity gain buffer topology.

BRIEF SUMMARY OF THE INVENTION

Telescopic operational amplifiers are provided. An exemplary embodiment of a telescopic operational amplifier (OPAMP) comprises a current source, an input stage and a load stage. The input stage is coupled to the current source and comprises a group of input transistors, for receiving an input voltage. The load stage is coupled to the input stage and comprises a group of load transistors, for outputting an output voltage. The threshold voltages of the group of input transistors are larger than the group of the load transistors.

Reference buffers are provided. An exemplary embodiment of a reference buffer comprises a telescopic OPAMP and an output stage. The telescopic OPAMP comprises a first current source, an input stage and a load stage. The input stage is coupled to the first current source and comprises a group of input transistors, for receiving an input voltage. The load stage is coupled to the input stage and comprises a group of load transistors, for generating an intermediate voltage. The threshold voltages of the group of input transistors are larger than the group of the load transistors. The output stage comprises an output transistor for receiving the intermediate voltage to generate an output voltage and returns the output voltage to the input stage of the telescopic OPAMP.

Another exemplary embodiment of a reference buffer comprises a first telescopic OPAMP, a second telescopic OPAMP and an output stage. The first telescopic OPAMP comprises a first current source, a first input stage and a first load stage. The first input stage is coupled to the first current source and comprises a first group of input transistors. The first load stage is coupled to the first input stage and comprises a first group of load transistors, for generating a first intermediate voltage. The threshold voltages of the group of input transistors are larger than that of the group of the load transistors. The second telescopic OPAMP comprises a second current source, a second input stage and a second load stage. The second input stage is coupled to the second current source and comprises a second group of input transistors. The second load stage is coupled to the second input stage and comprises a second group of load transistors, for generating a second intermediate voltage. The threshold voltages of the group of input transistors are larger than that of the group of the load transistors. The output stage comprises a first output transistor and a second output transistor. The first output transistor receives the first intermediate voltage to generate a first output voltage. The second output transistor receives the second intermediate voltage to generate a second output voltage. The output stage returns the first and second output voltages to the first and the second input stages.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
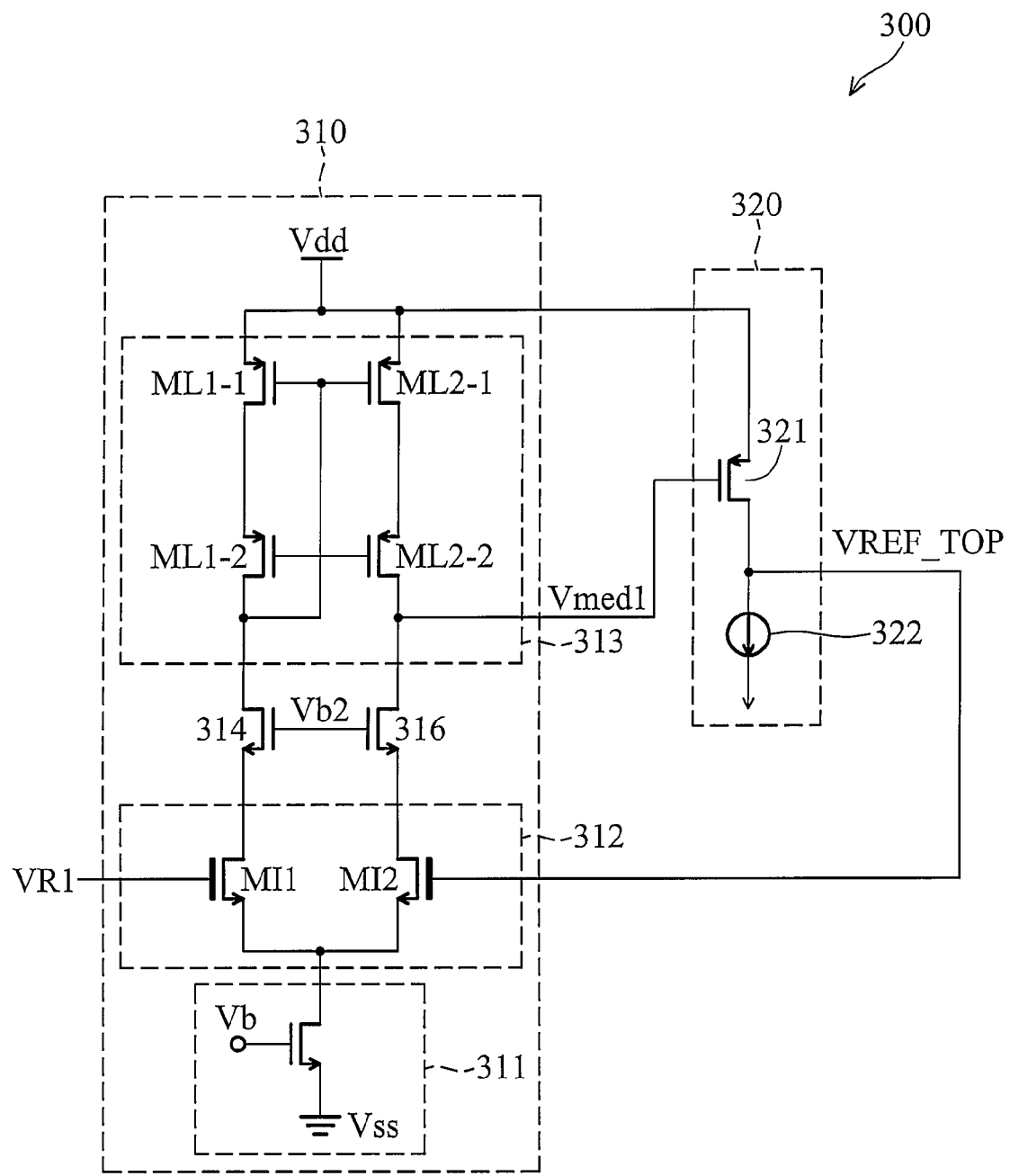
FIG. 3 is a schematic diagram of an exemplary embodiment of a reference buffer.

FIG. 3 is a schematic diagram of an exemplary embodiment of a reference buffer. Reference buffer 300 comprises an OPAMP 310 and an output stage 320. Output stage 320 receives an intermediate voltage Vmed1 generated from the OPAMP 310 to generate an output voltage VREF_TOP and returns the output voltage VREF_TOP to OPAMP 310. In this embodiment, the output stage 320 comprises an output transistor 321 and a current source 322. Output transistor 321 is connected in series between current source 322 and OPAMP 310.

OPAMP 310 is with a telescopic structure, i.e. a telescopic OPAMP, comprises a current source 311, an input stage 312, a load stage 313, and NMOS transistors 314 and 316. Current source 311 is coupled between input stage 312 and a voltage source Vss. In this embodiment, a NMOS transistor constitutes current source 311, and the gate of the NMOS transistor receives a bias voltage Vb.

Input stage 312 couples to current source 311 and comprises a group of input transistors for receiving an input voltage VR1. Load stage 313 couples to input stage 312 and comprises a group of load transistors for generating a voltage, e.g. intermediate voltage Vmed1. The threshold voltages of the group of input transistors are larger than that of the group of the load transistors. In this embodiment, the group of input transistors and the group of load transistor are NMOS transistors, but the disclosure is not limited thereto. Those skilled in the field may utilize BJTs or other suitable electronic components to replace the transistors.

The group of input transistors of input stage 312 comprises input transistors MI1 and MI2. Input transistors MI1 and MI2 are coupled between current source 311 and load stage 313. The gate of input transistor MI1 can be served as a positive terminal of OPAMP 310. The gate of input transistor MI2 can be served as a negative terminal of OPAMP 310 and receives the output voltage VREF_TOP so as to form a negative feedback loop.

In this embodiment, the threshold voltages of input transistors MI1 and MI2 are larger than that of other transistors utilized in the OPAMP 310. In one embodiment, the input transistors MI1 and MI2 can be 3.3V I/O devices, and other transistors can be 1.2V core devices. In another embodiment, input transistors MI1 and MI2 and other transistors can be fabricated by processes for regular low voltage (LV) transistors, and the input transistors MI1 and MI2 have larger threshold voltages (LV-HVT) than that of other transistors. For example, all transistors of OPAMP 310 are LV devices of which threshold voltages are smaller than 0.4V, wherein the threshold voltages of the input transistors MI1 and MI2 are larger (such as 0.6V). In another embodiment, the input transistors MI1 and MI2 can be native transistors, that is, the threshold voltages of the input transistors MI1 and MI2 are about 0V.

The group of load transistors of load stage 313 comprises load transistors ML1-1, ML1-2, ML2-1 and ML2-2. Load transistors ML1-1, ML1-2, ML2-1 and ML2-2 are LV devices. Input transistors MI1 and MI2 are high voltage (HV) (such as 3.3V) devices, OPAMP 310 is operated in low voltage mode, e.g. 1.8V or 1.2 V.

As shown in FIG. 3, load transistors ML1-1 and ML1-2 are serially connected to input transistor MI1 between a voltage source Vdd and current source 311. Load transistors ML2-1 and ML2-2 are serially connected to input transistor MI2 between the voltage source Vdd and current source 311. The drain of load transistor ML2-2 is served as an output terminal of OPAMP 310 for outputting an output voltage, e.g. the intermediate voltage Vmed1. Moreover, NMOS transistors 314 and 316 are respectively connected between the load stage 313 and the input stage 312, which can be regarded as cascade devices to increase the output impedance seeing at node of the intermediate voltage Vmed1.

Due to the telescopic structure of OPAMP 310, the gain and the bandwidth are greater and power consumption of the embodiment is reduced. Moreover, the threshold voltages of input transistors MI1 and MI2 exceed that of other transistors, thus ensuring the normal operation of the input transistor MI1 and MI2. For example, if the output voltage VREF_TOP is high (e.g. about 0.925V) while the OPAMP 310 is supplied by low voltage (e.g. about 1.2V), the voltage difference between the gate and the drain of the input transistor MI2 can be still smaller than the threshold voltage of the input transistor MI2 because the input transistors MI2 is a HV device of which the threshold voltage is high enough, and thus the input transistor MI2 can be operated in a saturation region. Additionally, since the output voltage VREF_TOP is high, the voltage different between the drain and the source of the NMOS of the current source 311 is high, too. Thus, the NMOS does not enter the linear region such that the current provided by the current source 311 will be substantially not reduced.

Figure 4:
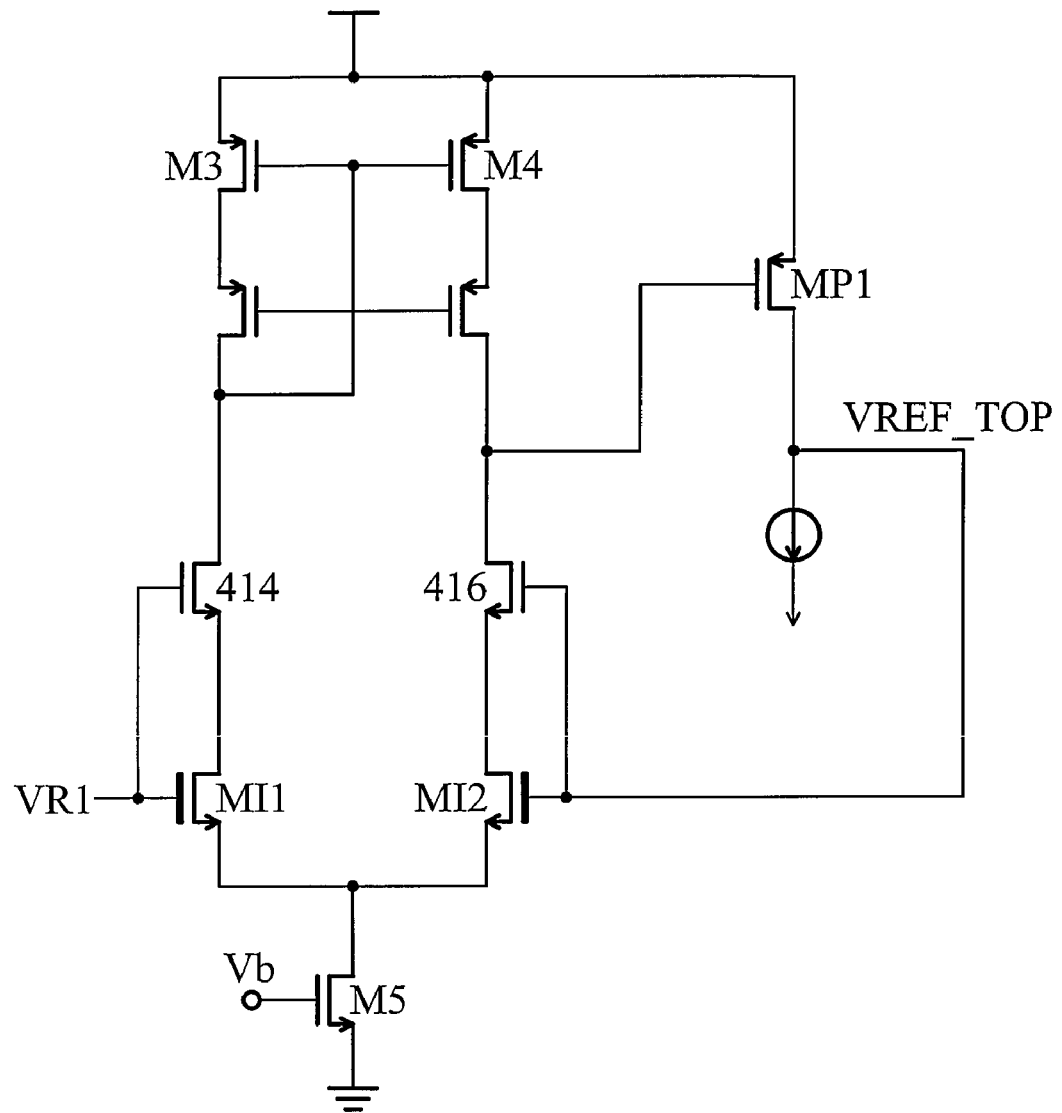
FIG. 4 is a schematic diagram of another exemplary embodiment of the reference buffer.

FIG. 4 is a schematic diagram of another exemplary embodiment of the reference buffer. FIG. 4 is similar to FIG. 3 with the exception that the connection relation between load transistors and input transistors. As shown in FIG. 4, the gate of the transistor 414 is coupled to the gate of the input transistor MI1 for receiving the input voltage VR1 and the gate of the transistor 416 is coupled to the gate of the input transistor MI2 for receiving the output voltage VREF_TOP. Referring to FIG. 3, since the gates of the transistors 314 and 316 receive an additional bias voltage Vb2, the current consumption in FIG. 3 is more than the current consumption in FIG. 4.

Figure 5:
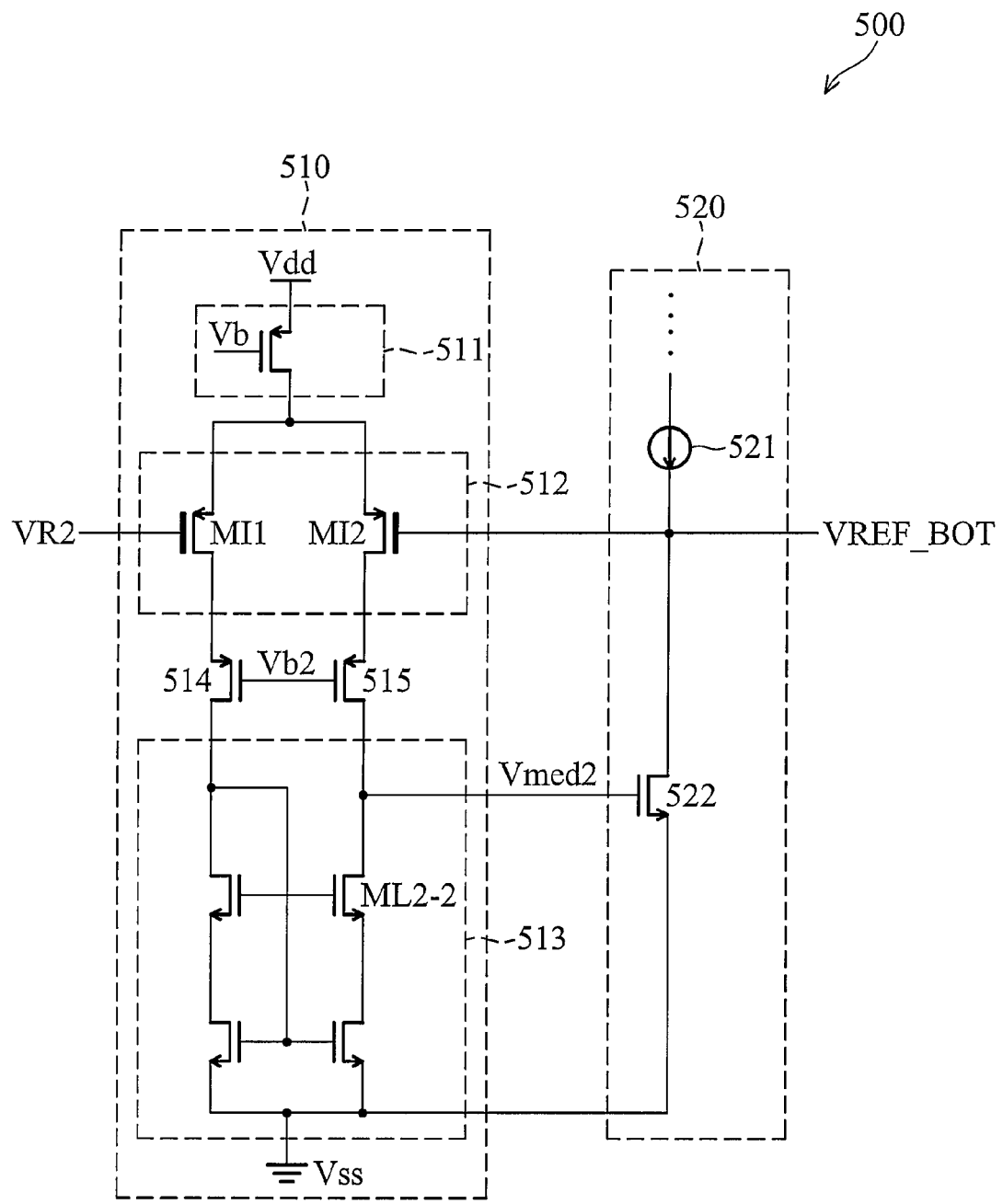
FIG. 5 is a schematic diagram of another exemplary embodiment of a reference buffer.

FIG. 5 is a schematic diagram of another exemplary embodiment of a reference buffer. Reference buffer 500 comprises an OPAMP 510 and an output stage 520. Output stage 520 receives an intermediate voltage Vmed2 generated from the OPAMP 510 to generate an output voltage VREF_BOP and returns the output voltage VREF_BOP to OPAMP 510. In this embodiment, the output stage 520 comprises a current source 521 and an output transistor 522.

OPAMP 510 is similar to that of OPAMP 310 with the exception that a current source 511 is coupled between voltage source Vdd and an input stage 512, and a load stage 513 is coupled between input stage 512 and voltage source Vss. PMOS transistors 514 and 516 are respectively connected between the load stage 513 and the input stage 512, which can be regarded as cascade devices to increase the output impedance seeing at node of the intermediate voltage Vmed2. The voltage provided by voltage source Vdd is greater than the voltage provided by the voltage source Vss.

With reference to FIG. 5, the connection relationship of OPAMP 510 is described in the following. A positive terminal of OPAMP 510, e.g. the gate of input terminal MI1, receives voltage VR2. A negative terminal of OPAMP 510, e.g. the gate of input transistor MI2, is coupled to the drain of output transistor 522. An output terminal of OPAMP 510, e.g. the drain of load transistor ML2-2, is coupled to the gate of output transistor 522.

Since the bandwidth of the OPAMPs shown in FIGS. 3-5 can be extended, the settling time is shorter. The gain of the OPAMP is considerably high such that the OPAMP achieves better PSRR. The power consumption of the OPAMP is reduced. Additionally, the voltage reference range of the reference buffer is enlarged such that the reference buffer has better SNR.

Figure 6:
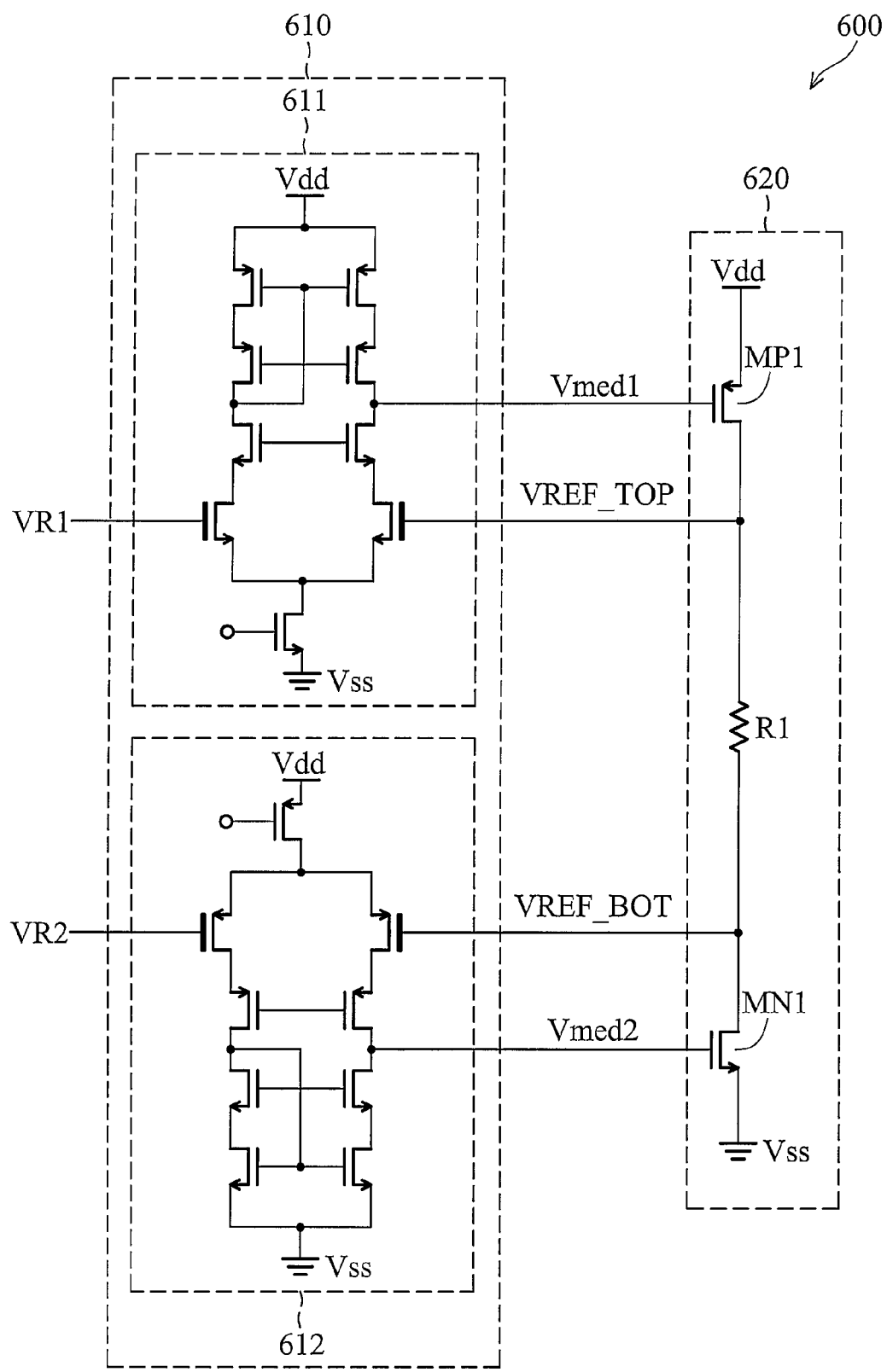
FIG. 6 is a schematic diagram of an exemplary embodiment of a reference buffer.

FIG. 6 is a schematic diagram of another exemplary embodiment of a reference buffer. Reference buffer 600 comprises stage circuits 610 and 620. The stage circuit 610 provides high gain, and the stage circuit 620 reduces output impedance and also provides gain. In this embodiment, the stage circuit 610 comprises OPAMPs 611 and 612, and the stage circuit 620 comprises output transistors MP1, MN1, and a resistor R1. Output transistor MP1 is arranged to receive the intermediate voltage Vmed1 to generate an output voltage VREF_TOP. Output transistor MN1 is arranged to receive the intermediate voltage Vmed2 to generate another output voltage VREF_BOT. OPAMPs 611 and 612 have the telescopic structure. Since the structure of OPAMP 611 is the same as the structure of OPAMP 310 and the structure of OPAMP 612 is the same as the structure of OPAMP 510, descriptions of OPAMP 611 and 612 are omitted for brevity. The output transistors MP1, MN1, and resistor R1 are serially connected between voltage sources Vdd and Vss.

To apply in reference buffer 600, the positive terminal of OPAMP 611 receives an input voltage VR1, the negative terminal of OPAMP 611 is coupled to the drain of output transistor MP1 for receiving an output voltage VREF_TOP. OPAMP 611 outputs an intermediate voltage Vmed1 to the gate of output transistor MP1. Similarly, the positive terminal of OPAMP 612 receives another input voltage VR2 and the negative terminal of OPAMP 612 is coupled to the drain of output transistor MN1 for receiving another output voltage VREF_BOP. OPAMP 612 outputs another intermediate voltage Vmed2 to the gate of output transistor MN1.

The current $I_{2ndstage}$ passing through the output stage 620 is expressed by the following equation (1):

$$I_{2ndstage} = \frac{VREF\_TOP - VREF\_BOT}{R} \quad (1)$$

wherein R is an impedance of the resistor R1.

Figure 1:
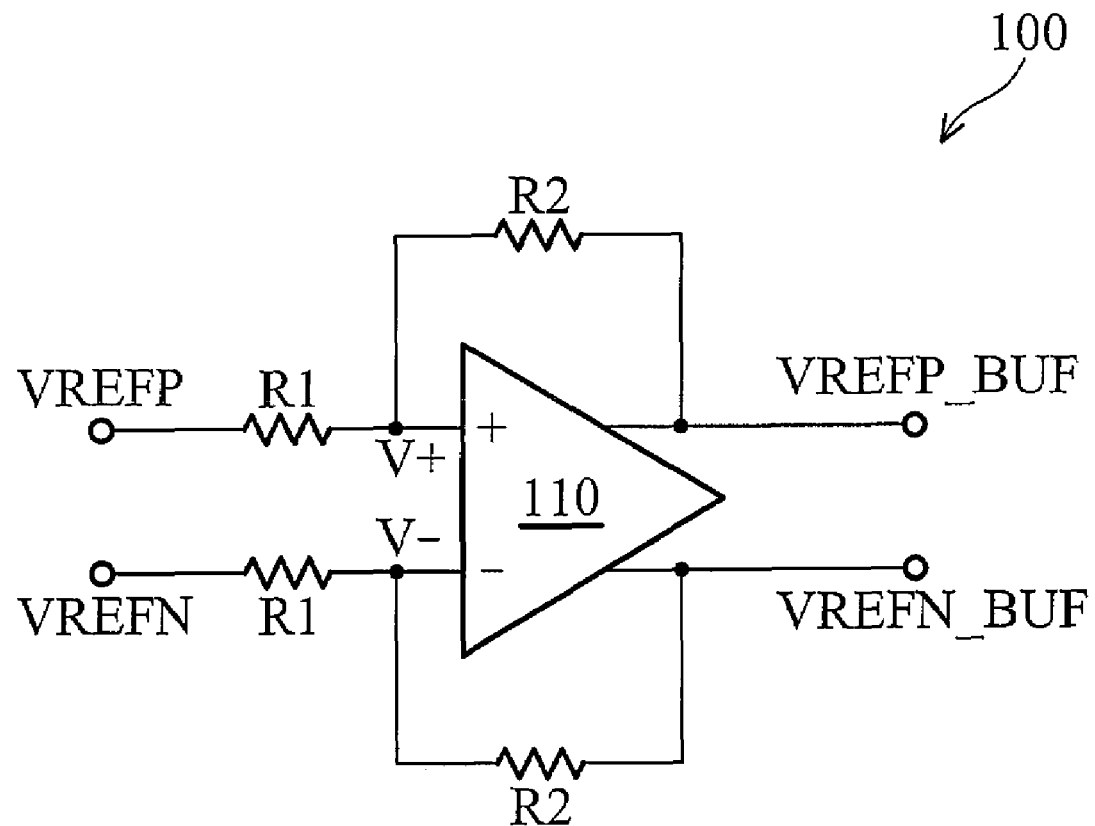
FIG. 1 is a schematic diagram of a conventional reference buffer.
Figure 2:
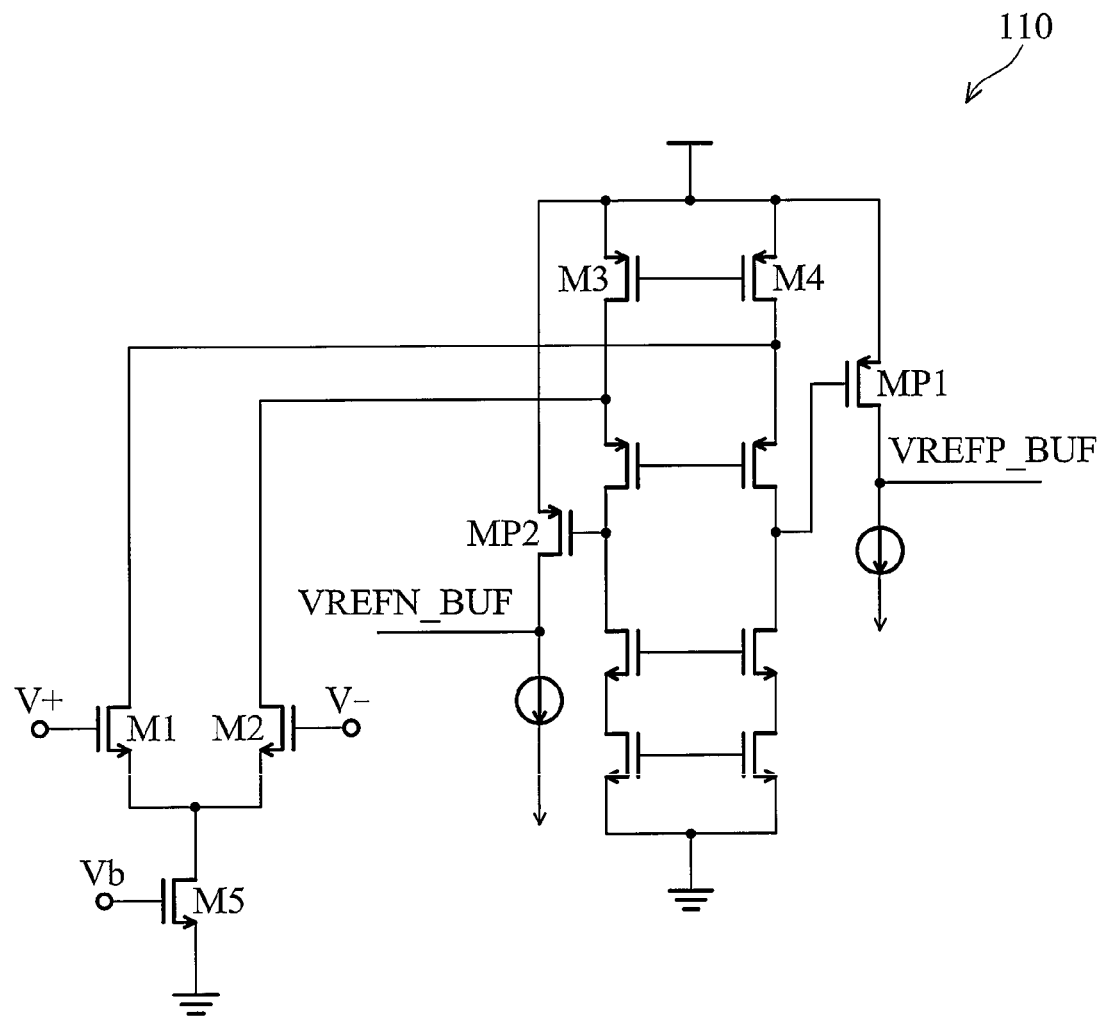
FIG. 2 is a schematic diagram of the differential OPAMP.

Since reference buffer 600 comprises one output stage (such as 620) for the two OPAMPs 611 and 612, the current consumption of reference buffer 600 is a half of the current consumption of differential OPAMP 110 as illustrated in FIG. 1 under the same bandwidth condition. Additionally, OPAMPs 611 and 612 constitute unity gain buffer, and therefore the feedback factor is approximately 1. The embodiment thus extends its closed loop bandwidth, and achieves better high-frequency PSRR (power supply rejection ratio).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A telescopic operational amplifier (OPAMP), comprising:
   a current source;
   an input stage, coupled to the current source and comprising a group of input transistors, for receiving an input voltage, wherein the group of input transistors comprises a first input transistor and a second input transistor connected to the first input transistor, and the first and second input transistors are coupled between the current source and the load stage; and
   a load stage, coupled to the input stage and comprising a group of load transistors, for outputting an output voltage, wherein the threshold voltages of the group of input transistors are larger than that of the group of the load transistors,
   wherein the group of load transistors comprises:
   a plurality of first load transistors connected to the first input transistor in series between a voltage source and the current source, wherein a gate of one of the first load transistors is coupled to a gate of the first input transistor for receiving the input voltage; and
   a plurality of second load transistors connected to the second input transistor in series between the voltage source and the current source, wherein a gate of one of the second load transistors is coupled to a gate of the second input transistor for coupling the output voltage.

2. The telescopic OPAMP as claimed in claim 1, wherein the group of input transistors and the group of load transistors are MOS transistors.

3. A reference buffer, comprising:
   a telescopic operational amplifier (OPAMP) comprising:
   a first current source;
   an input stage, coupled to the first current source and comprising a group of input transistors, for receiving an input voltage, wherein the group of input transistors comprises a first input transistor and a second input transistor connected to the first input transistor, and the first and second input transistors are coupled between the first current source and the load stage; and
   a load stage, coupled to the input stage and comprising a group of load transistors, for generating an intermediate voltage, wherein the threshold voltages of the group of input transistors are larger than that of the group of the load transistors; and
   an output stage comprising an output transistor for receiving the intermediate voltage to generate an output voltage and returning the output voltage to the input stage of the telescopic OPAMP,
   wherein the group of load transistors comprises:
   a plurality of first load transistors connected to the first input transistor in series between a voltage source and the first current source; and
   a plurality of second load transistors connected to the second input transistor in series between the voltage source and the first current source.

4. The reference buffer as claimed in claim 3, wherein the group of input transistors and the group of load transistors are MOS transistors.

5. The reference buffer as claimed in claim 3, wherein the output stage further comprises a second current source, wherein the output transistor is connected in series between the load stage and the second current source.

6. The reference buffer as claimed in claim 3, wherein a gate of one of the first load transistors is coupled to a gate of the first input transistor for receiving the input voltage, and a gate of one of the second load transistors is coupled to a gate of the second input transistor for coupling the output voltage.

7. A reference buffer, comprising:
   a first telescopic operational amplifier (OPAMP) comprising:
   a first current source;
   a first input stage, coupled to the first current source and comprising a first group of input transistors, wherein the first group of input transistors comprises a first input transistor and a second input transistor connected to the first input transistor, and the first and second input transistors are coupled between the first current source and the first load stage; and
   a first load stage, coupled to the first input stage and comprising a first group of load transistors, for generating a first intermediate voltage, wherein the threshold voltages of the first group of input transistors are larger than that of the first group of the load transistors; and
   a second telescopic OPAMP comprising:
   a second current source;
   a second input stage, coupled to the second current source and comprising a second group of input transistors, wherein the second group of input transistors comprises a third input transistor and a fourth input transistor connected to the third input transistor, and the third and fourth input transistors are coupled between the second current source and the second load stage; and
   a second load stage, coupled to the second input stage and comprising a second group of load transistors, for generating a second intermediate voltage, wherein the threshold voltages of the second group of input transistors are larger than that of the second group of load transistors; and
   an output stage comprising a first output transistor and a second output transistor, wherein the first output transistor is arranged to receive the first intermediate voltage to generate a first output voltage, the second output transistor is arranged to receive the second intermediate voltage to generate a second output voltage, and the output stage is arranged to return the first and second output voltages to the first and the second input stages, respectively, wherein the first group of load transistors comprises a plurality of first load transistors and a plurality of second load transistors, the second group of load transistors comprises a plurality of third load transistors and a plurality of fourth load transistors, the first load transistors serially connects to the first input transistor between a first voltage source and the first current source, the second load transistors serially connects to the second input transistor between the first voltage source and the first current source, the third load transistors serially connects to the third input transistor between a second voltage source and the second current source, and the fourth load transistors serially connects to the fourth input transistor in series between the second voltage source and the second current source.

8. The reference buffer as claimed in claim 7, wherein the first and the second groups of input transistors and the first and the second groups of load transistors are MOS transistors.

9. The reference buffer as claimed in claim 7, wherein the output stage further comprises a resistor coupled between the first and the second output transistors.

10. The reference buffer as claimed in claim 7, wherein a voltage provided by the first voltage source is larger than a voltage provided by the second voltage source.

11. The reference buffer as claimed in claim 7, wherein the first current source is coupled between the first input stage and the second voltage source, and the second current source is coupled between the second input stage and the first voltage source.

12. The reference buffer as claimed in claim 7, wherein a gate of one of the first load transistors is coupled to a gate of the first input transistor for receiving the first input voltage, a gate of one of the second load transistors is coupled to a gate of the second input transistor for receiving the first output voltage, a gate of one of the third load transistors is coupled to a gate of the third input transistor for receiving the second input voltage, and a gate of one of the fourth load transistors is coupled to a gate of the fourth input transistor for receiving the second output voltage.

* * * * *